(12) United States Patent
Lee et al.

(10) Patent No.: US 6,482,664 B1
(45) Date of Patent: Nov. 19, 2002

(54) METHOD FOR MANUFACTURING WHITE LIGHT-EMITTING DIODES

(75) Inventors: Jeong-Hoon Lee, 305-701 Olympic Apartment PangE-dong, Sonpa-gu, Seoul-city (KR); Joufuku Kanekiyo, Kyoto (JP); Kwang-Jung Kim, Seoul (KR)

(73) Assignee: Jeong-Hoon Lee, Seoul (KR)

( * ) Notice: Subject to any disclaimer, the term of this patent is extended or adjusted under 35 U.S.C. 154(b) by 0 days.

(21) Appl. No.: 09/975,003

(22) Filed: Oct. 12, 2001

(51) Int. Cl.[7] .............................................. H01L 21/00
(52) U.S. Cl. ............................ 438/28; 438/26; 438/33; 438/34; 438/35; 438/106; 438/107; 438/112; 438/113
(58) Field of Search ............................ 438/26, 28, 33, 438/34, 35, 106, 107, 113, 112

(56) References Cited

U.S. PATENT DOCUMENTS 5,131,877 A * 7/1992 Mathumoto

FOREIGN PATENT DOCUMENTS

JP    408156393 A   *   6/1996

* cited by examiner

*Primary Examiner*—Long Pham
(74) *Attorney, Agent, or Firm*—Bacon & Thomas, PLLC

(57) ABSTRACT

Disclosed is a method for manufacturing white light-emitting diodes (white LEDs) which is capable of manufacturing white LEDs having a superior and uniform quality and a slim structure while simplifying the manufacturing process, thereby reducing the manufacturing costs and time, and achieving a considerable improvement in the yield of those white LEDs. The method involves the steps of mixing a fluorescent dye, adapted to convert blue light into white light, with molding compound powder, thereby preparing a mixture, subjecting the mixture to a desired temperature and a desired pressure, thereby shaping the mixture to have a desired shape, simultaneously transfer-molding the shaped mixture on the blue-light emitting diode chips, thereby forming a molded product, and dicing the molded product into individual white LEDs. Since the method of the present invention eliminates use of a potting process used in conventional methods, it can manufacture white LEDs having a slim structure. In accordance with the method of the present invention, the manufacturing process is simplified, thereby reducing the manufacturing costs and time. Also, it is possible to achieve a considerable improvement in the yield of white LEDs having a superior and uniform quality.

6 Claims, 4 Drawing Sheets

PRIOR ART

PRIOR ART

PRIOR ART

METHOD FOR MANUFACTURING WHITE LIGHT-EMITTING DIODES

FIELD OF THE INVENTION

The present invention relates to a method for manufacturing white light-emitting diodes using epoxy resin powder mixed with a fluorescent material adapted to convert a wavelength of white light into a wavelength of blue light emitted from a blue light-emitting diode.

DESCRIPTION OF THE RELATED ART

Generally, a white light-emitting diode (LED) is manufactured by placing a liquid resin, mixed with a fluorescent dye, over a blue LED in an encapsulated state. Here, white light has light components uniformly distributed in a wavelength range from 400 nm to 600 nm. Blue light generated by a combination of red, green and blue lights reacts with fluorescent substances respectively emitting red and green lights, thereby exhibiting red and green colors. Lights of these red and green colors are then combined with the blue light transmitted without reacting with the fluorescent substances, thereby causing the human eye to finally view white color.

Referring to FIGS. 3 to 7, diverse structures of LEDs emitting white light (white LEDs) are illustrated which are manufactured in accordance with diverse conventional methods, respectively. That is, such white LED structures may be manufactured using a method involving the steps of attaching a blue LED chip on a printed circuit board (PCB) or a lead frame made of aluminum, potting the blue LED chip with a fluorescent dye, encapsulating the potted chip in accordance with a transfer molding process, and dicing the resulting structure into individual products, a method involving the steps of potting a plastic mold having a desired shape with a fluorescent dye by use of a dispenser, and encapsulating the resulting structure using epoxy, or a method involving the steps of potting a lead frame with a fluorescent dye, and molding the resulting structure using a mold cup having a lamp shape, thereby forming an LED lamp.

Generally, such white LEDs are applied to back illumination for liquid crystal displays (LCDs) and displays for electric home appliances and industrial appliances. Recently, the application of white LEDs has been extended to back illumination for LCDs used in portable electronic products having a light-weight, slim, simple, and miniaturized structure, such as portable radio communication units (i.e cellular phone), and LCDs used in vehicles, in pace with development of associated techniques and diverse demands of consumers. For this reason, white LEDs have been required to have a reduced size. However, known methods of manufacturing white LEDs have a limitation in reducing the size of those white LEDs. Furthermore, there is a problem in that the yield of products having a desired quality or higher is degraded. In addition, the amount of the fluorescent material coated on the chip may be non-uniform. This may result in a severe color deviation among products. There may also be an increase in the processing time taken in the manufacture of products, and an increase in the manufacturing costs.

SUMMARY OF THE INVENTION

Therefore, an object of the invention is to provide a method for manufacturing white LEDs, which involves the steps of mixing a fluorescent dye with molding compound powder such as resin powder, compressing the mixture, thereby producing a molding compound compact, and transfer-molding the molding compound compact on a blue LED chip, thereby being capable of forming a white LED serving to convert blue light emitted from the blue LED chip into white light, thereby emitting the white light, while eliminating the potting process used in conventional cases, thereby allowing the white LED to have a slim structure suitable for back illumination for LCDs and other displays used in electronic products having a light-weight, slim, simple, and miniaturized structure, simplifying the manufacturing process to reduce the manufacturing costs and the time taken in manufacturing the white LED, and achieving a considerable improvement in the yield of products having a desired quality.

In accordance with the present invention, this object is accomplished by providing a method for manufacturing white light-emitting diodes adapted to convert a blue light emitted from blue light-emitting diode chips into white light using a fluorescent dye, each of the blue-light emitting diode chips being mounted on a printed circuit board or a lead frame while being bonded to the printed circuit board or the lead frame by a conductive or non-conductive adhesive and having electrodes electrically connected with a circuit pattern plated on the printed circuit board or the lead frame, comprising the steps of: mixing the fluorescent dye with molding compound powder, thereby preparing a mixture; subjecting the mixture to a desired temperature and a desired pressure, thereby shaping the mixture to have a desired shape (for example, a tablet shape); simultaneously transfer-molding the shaped mixture on the blue-light emitting diode chips, thereby forming a molded product; and dicing the molded product into individual white light-emitting diodes using, for example, a dicer. Thus, white light-emitting diodes (white LEDs) are provided which convert a wavelength of white light into a wavelength of blue light emitted from a blue light-emitting diode, thereby emitting white light. The white LEDs manufactured by the method of the present invention can easily and inexpensively emit white light of a high quality, as compared to white LEDs manufactured using a fluorescent dye mixed with a liquid epoxy resin.

BRIEF DESCRIPTION OF THE DRAWINGS

The above and other objects, features and other advantages of the present invention will be more clearly understood from the following detailed description taken in conjunction with the drawings, in which.

DESCRIPTION OF THE PREFERRED EMBODIMENTS

Figure 1:
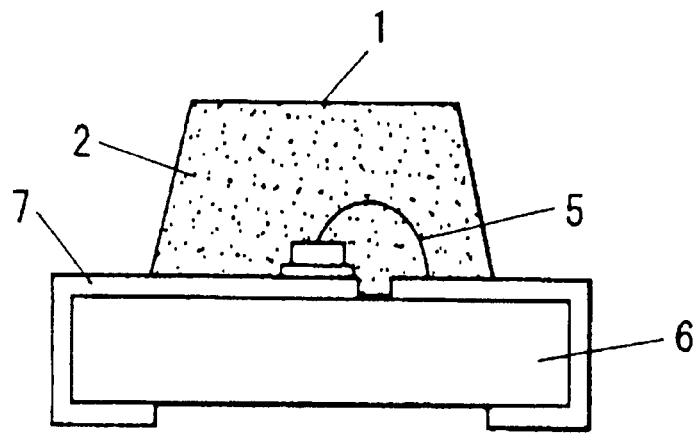
FIG. 1 is a sectional view illustrating a white LED having a single connecting wire.
Figure 2:
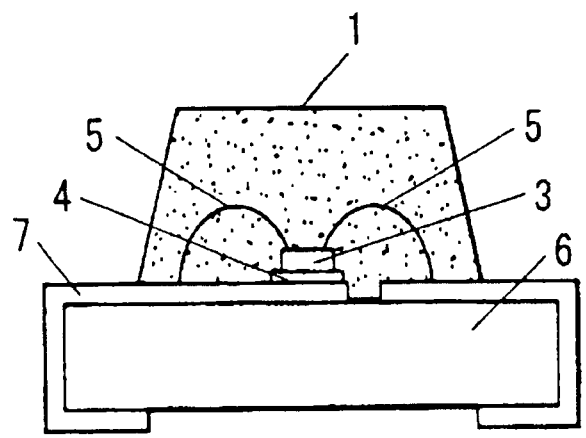
FIG. 2 is a sectional view illustrating a white LED having two connecting wires.
Figure 3:
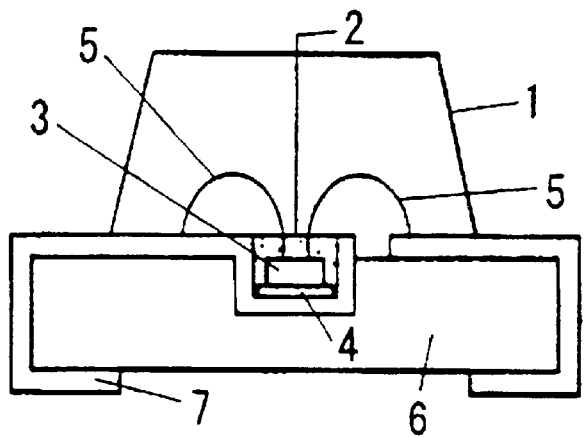
FIG. 3 is a sectional view illustrating an example of a conventional white LED.
Figure 4:
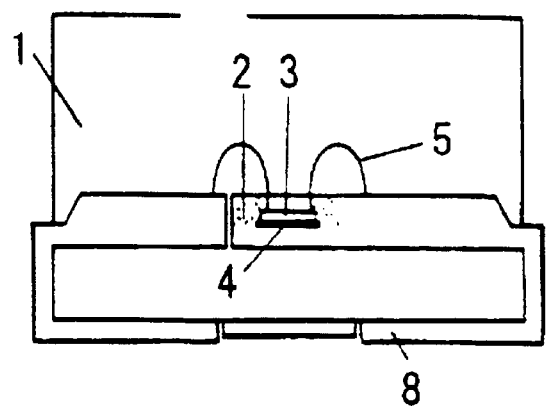
FIG. 4 is a sectional view illustrating another example of a conventional white LED.
Figure 5:
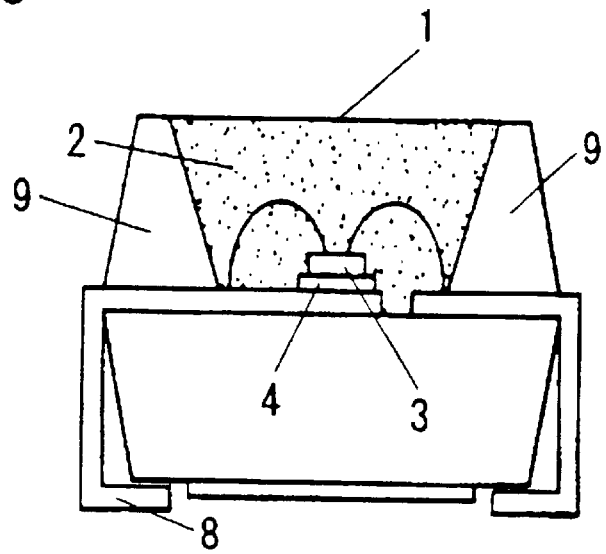
FIG. 5 is a sectional view illustrating another example of a conventional white LED.
Figure 6:
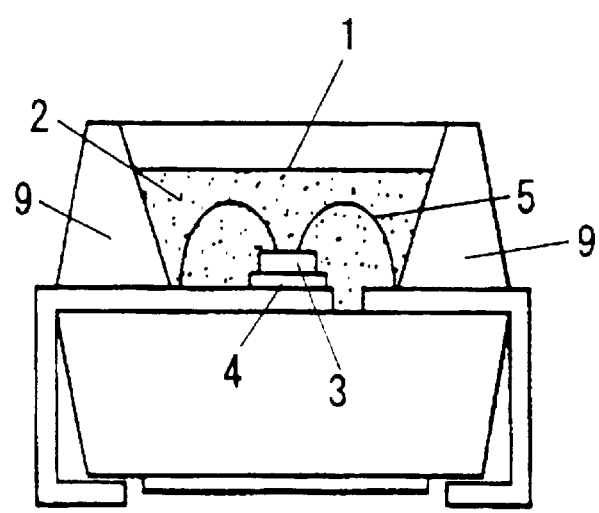
FIG. 6 is a sectional view illustrating another example of a conventional white LED.
Figure 7:
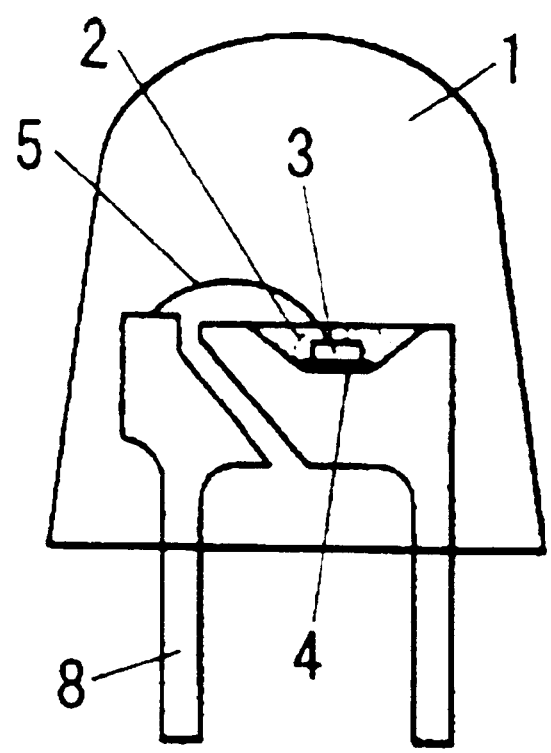
FIG. 7 is a sectional view illustrating another example of a conventional white LED.

Now, preferred embodiments of the present invention will be described in conjunction with FIGS. 1 and 2. In all drawings, the same elements are denoted by the same reference numeral. In the drawings, the reference numeral 1 denotes a molded encapsulate, 2 a fluorescent dye, 3 a LED chip, 4 an adhesive such as Ag paste, 5 an Au or Al wire, and 6 a PCB. FIGS. 1 and 2 are sectional views illustrating a white LED manufactured in accordance with the present invention, respectively.

In order to manufacture the white LED in accordance with the present invention, the LED chip 3 serving to emit blue light is first bonded to a lead frame on which the PCB 6 is mounted. Typically, the PCB 6 has a desired circuit pattern formed of diverse plated layers. In order to cure the adhesive, the resulting structure is maintained under curing conditions meeting the characteristics of the adhesive, for example, at 100 to 150° C. for about 30 minutes to one hour. Electrodes provided at the blue LED 3 are then electrically connected to the circuit pattern provided at the PCB 6 or lead frame 7 by a conductive material. In accordance with the structure of the blue LED 3, the electrical connection may be variously achieved using diverse methods. Also, the electrical connection may have diverse structures.

The number of LED products manufactured at once may be varied in accordance with the pattern formed on the PCB 6 or lead frame 7.

Meanwhile, a molding compound such as resin powder is prepared, and then uniformly mixed with a fluorescent dye, specifically treated to have the form of solid powder, such as $(Y,Ce)_3Al_5O_{12}$ or $(Y,Gd,Ce)_3Al_5O_{12}$, in a desired ratio corresponding to a desired white light level. Preferably, the content of the fluorescent dye in the powder mixture is 5 to 50% based on the weight of the molding compound. In order to conveniently achieve a mass production of desired LED products while eliminating formation of bubbles in final products, the powder mixture is placed in a mold having a desired structure, and then compressed under a desired pressure, for example, a pressure of 4.9 to 29.4 MPa (300 kg/cm$^2$). The brightness and wavelength of light emitted from the LED product can be adjusted by adjusting the contents of Gd and Ce in the fluorescent dye.

Several PCBs 6 prepared prior to the above mentioned procedure are placed on a transfer molding press (not shown) provided with transfer molds. The number of PCBs 6 placed on the transfer molding press is determined by the number of molds provided at the transfer molding press. The molding compound added with the fluorescent dye and shaped into tablets is placed in the molds. In this state, a transfer molding process is carried out at a temperature of 130 to 180° C. and a pressure of 0.5 to 2 ton/cm$^2$ for 200 to 600 seconds to mold the molding compound on the PCBs 6.

Following the transfer molding process, a dicing process is carried out in order to cut the molded product into individual LED products (that is, white LEDs) each including one LED chip. The LED products may be subsequently maintained at a temperature of 100 to 250° C. for about one hour in order to remove moisture formed during the dicing process, thereby stabilizing the products. Thus, white LEDs are completely produced.

Thereafter, the white LEDs are tested to measure the brightness and wavelength of light emitted from each of the white LEDs, thereby determining whether or not they have a desired white light level. Based on the measurement results, the white LEDs are appropriately sorted. The sorted white LEDs are wound on a reel for shipment, using automation equipment, so that their subsequent surface mounting can be conveniently conducted.

Thus, it is possible to easily manufacture white LEDs of FIGS. 1 and 2 adapted to emit white light while eliminating the process of respectively potting individual blue LED chips with a fluorescent dye mixed with a liquid epoxy resin and without any considerable modification from the existing process used to manufacture LEDs adapted to emit light of a typical wavelength (for example, 430 nm, 450 nm, 470 nm, 570 nm, 590 nm, 600 nm, 620 nm, 635 nm, or 660 nm). In accordance with the present invention, it is also possible to manufacture a super-slim product having a maximum thickness reduced to about 0.2 mm. Using these products, electronic products having a compact structure can be manufactured, as compared to conventional electronic products. White LEDs having the same fluorescent dye composition can be manufactured in mass production, using a single transfer molding process. Also, it is possible to manufacture LED products exhibiting very small chromaticity deviations on a color coordinate system developed by CIE (Commission Internationale de l'Eclarge) while having a superior throughput meeting strict quality conditions. For example, it is possible to manufacture LED products having a uniform quality exhibiting a standard deviation of 0.05 or less in terms of deviations (x and y-coordinate values) on the color coordinate system of CIE with respect to target white color. In addition, the manufacturing time and costs can be reduced because it is unnecessary to respectively pot individual blue LED chips with a fluorescent dye.

The application of the white LED according to the present invention is not limited to back illumination for LCDs or other displays adapted to emit white light and used in portable electronic products such as portable telephone or other portable radio communication units (i.e. cellular phone), and LCDs used in vehicles and electric home appliances. The white LED of the present invention is also applicable to electric appliances such as fluorescent lamps emitting white light and all kinds of electronic appliances using LEDs.

As apparent from the above description, the present invention provides a method for manufacturing white LEDs, which involves the steps of mixing a fluorescent dye with molding compound powder such as resin powder, and transfer-molding the mixture on a blue LED chip, thereby being capable of forming a white LED serving to convert blue light emitted from the blue LED chip into white light by virtue of the florescent dye, thereby emitting the white light. Although conventional methods cannot manufacture white LEDs having a superior and uniform quality because individual blue LED chips are potted with a fluorescent dye in order to emit white light, respectively, the method of the present invention allows LED products, manufactured in a single manufacturing process, to have a uniform mold composition, thereby maximizing the white-emitting throughput. In the conventional methods involving the steps of respectively potting individual blue LED chips with a fluorescent dye, and molding a molding compound, such as molding resin, on the blue LED chips, it is impossible to reduce the thickness of each LED product to a desired thickness or less. In accordance with the present invention, however, it is possible to manufacture LED products having a slim structure with a greatly reduced thickness by virtue of an elimination of the potting process. Using these products, electronic appliances having a compact, light-weight, slim, simple, and miniaturized structure can be manufactured. Since unnecessary processes are eliminated in accordance with the present invention, it is possible to manufacture white LEDs having superior characteristics while reducing the manufacturing costs and the time consuming in manufacturing those white LEDs.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing white light-emitting diodes adapted to convert a blue light emitted from blue light-emitting diode chips into white light using a fluorescent dye, each of the blue-light emitting diode chips being mounted on a printed circuit board or a lead frame while being bonded to the printed circuit board or the lead frame by a conductive or non-conductive adhesive and having electrodes electrically connected with a circuit pattern plated on the printed circuit board or the lead frame, comprising the steps of:

mixing the fluorescent dye with molding compound powder, thereby preparing a mixture;

subjecting the mixture to a desired temperature and a desired pressure, thereby shaping the mixture to have a desired shape;

simultaneously transfer-molding the shaped mixture on the blue-light emitting diode chips, thereby forming a molded product; and dicing the molded product into individual white LEDs.

2. The method according to claim 1, wherein the fluorescent dye is mixed with the molding compound in an amount of 5 to 50% based on the weight of the molding compound.

3. The method according to claim 1 or 2, wherein the mixture is compressed by a pressure of 4.9 to 29.4 MPa so that it is shaped into tablets.

4. The method according to any one of claims 1 to 3, wherein the fluorescent dye has a composition having contents of Gd and Ce adjustable to adjust the brightness, wavelength, and color of light emitted from the white LEDs.

5. The method according to any one of claims 1 to 4, wherein the white LEDs have a very slim structure having a thickness reduced to 0.2 mm at most.

6. The method according to any one of claims 1 to 5, wherein the white LEDs has a uniform quality exhibiting a standard deviation of 0.05 or less in terms of deviations (x and y-coordinate values) on a color coordinate system of CIE (Commission Internationale de l'Eclarge) with respect to a target white color.

* * * * *